United States Patent
Kawada

(10) Patent No.: US 9,793,121 B2
(45) Date of Patent: Oct. 17, 2017

(54) METHOD OF MANUFACTURING SILICON CARBIDE SEMICONDUCTOR DEVICE

(71) Applicant: FUJI ELECTRIC CO., LTD., Kawasaki-shi, Kanagawa (JP)

(72) Inventor: Yasuyuki Kawada, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/200,105

(22) Filed: Jul. 1, 2016

(65) Prior Publication Data
US 2016/0314973 A1 Oct. 27, 2016

Related U.S. Application Data

(63) Continuation of application No. PCT/JP2015/066078, filed on Jun. 3, 2015.

(30) Foreign Application Priority Data

Jul. 24, 2014 (JP) ................................. 2014-151279

(51) Int. Cl.
| | |
|---|---|
| H01L 21/04 | (2006.01) |
| H01L 29/16 | (2006.01) |
| H01L 29/66 | (2006.01) |
| H01L 29/872 | (2006.01) |

(52) U.S. Cl.
CPC ...... H01L 21/0485 (2013.01); H01L 29/1608 (2013.01); H01L 29/6606 (2013.01); H01L 29/872 (2013.01)

(58) Field of Classification Search
CPC ............. H01L 21/0485; H01L 29/1608; H01L 29/6606; H01L 29/872; H01L 21/76889
See application file for complete search history.

(56) References Cited

U.S. PATENT DOCUMENTS

| | | |
|---|---|---|
| 2011/0233560 A1 | 9/2011 | Koike et al. |
| 2015/0194313 A1 | 7/2015 | Ryo et al. |

FOREIGN PATENT DOCUMENTS

| | | |
|---|---|---|
| JP | 2002-217129 A | 8/2002 |
| JP | 2006-024880 A | 1/2006 |
| JP | 2006-332358 A | 12/2006 |
| JP | 2010-103229 A | 5/2010 |
| JP | 2013-219150 A | 10/2013 |
| JP | 2013-222823 A | 10/2013 |
| WO | WO-2011/115294 A1 | 9/2011 |

*Primary Examiner* — Charles Garber
*Assistant Examiner* — Brigitte Paterson
(74) *Attorney, Agent, or Firm* — Rabin & Berdo, P.C.

(57) ABSTRACT

A method of manufacturing a silicon carbide semiconductor device, having a silicon carbide semiconductor element substrate and a surface electrode film forming an ohmic contact between them. A first electrode film including nickel is formed on the substrate surface. A second electrode film with nickel silicide is formed on a first electrode film surface. The surface film is formed having the ohmic contact between the substrate surface and the first electrode film by annealing to cause silicon of the substrate and nickel of the first electrode film to react and convert the first electrode film to silicide. The first electrode film is formed with a thickness so that during annealing, an amount of carbon atoms is liberated from the substrate and diffuses toward the first electrode film, wherein the liberated amount is equal to or less than the amount of carbon atoms that the second electrode film is able to take in during annealing.

8 Claims, 4 Drawing Sheets

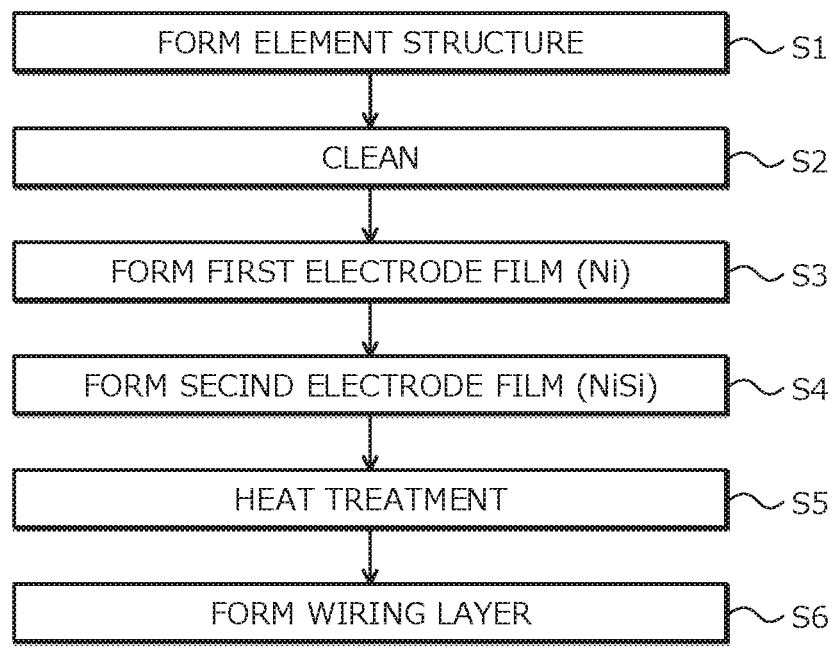
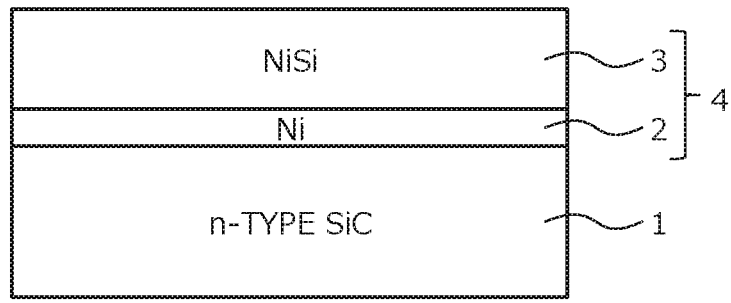

FIG.4

| Ni FILM THICKNESS | Si (atm%) | Ni (atm%) | C (atm%) |
|---|---|---|---|
| 5nm | 32 | 60 | 8 |
| 10nm | 37 | 49 | 14 |
| 15nm | 24 | 47 | 29 |

FIG.5

| NiSi FILM THICKNESS | Si (atm%) | Ni (atm%) | C (atm%) |
|---|---|---|---|
| 50nm | 27 | 50 | 23 |
| 80nm | 29 | 57 | 14 |
| 120nm | 34 | 54 | 12 |

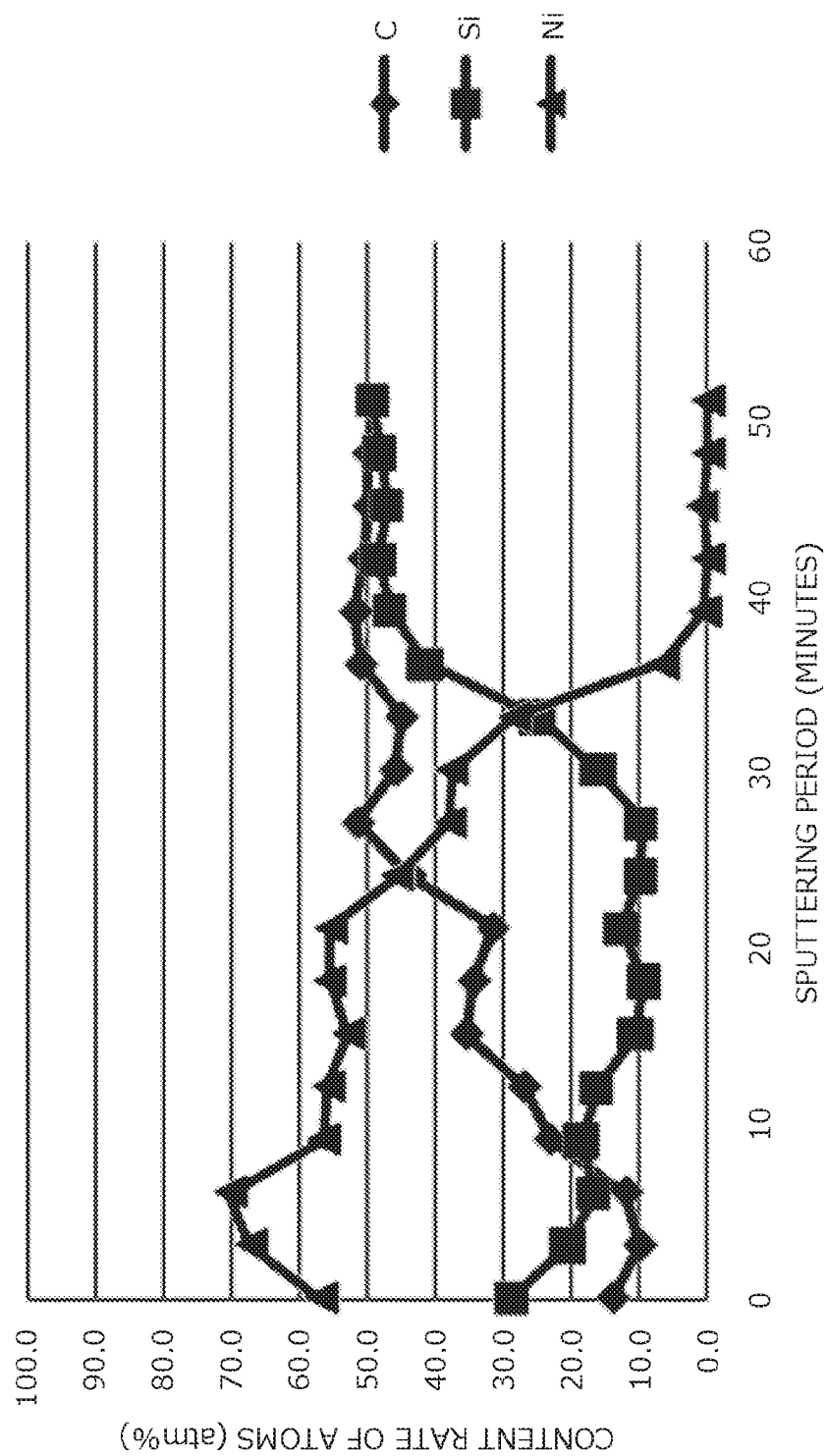

METHOD OF MANUFACTURING SILICON CARBIDE SEMICONDUCTOR DEVICE

CROSS REFERENCE TO RELATED APPLICATIONS

This is a continuation application of International Application PCT/JP2015/066078 filed on Jun. 3, 2015 which claims priority from a Japanese Patent Application No. 2014-151279 filed on Jul. 24, 2014, the contents of which are incorporated herein by reference.

BACKGROUND OF THE INVENTION

1. Field of the Invention

The embodiments of the invention discussed herein relate to a method of manufacturing a silicon carbide semiconductor device.

2. Description of the Related Art

Silicon carbide (SiC) semiconductors are thermally, chemically, and mechanically stable; and applications in, for example, light emitting devices, high frequency devices, and power semiconductor devices (power devices) in various industries is expected. In particular, high-voltage power metal oxide semiconductor field effect transistors (MOSFET) that use a SiC semiconductor have an advantage of a lower ON resistivity as compared to high-voltage power MOSFETs that use a silicon (Si) semiconductor. Further, Schottky diodes that use a SiC semiconductor have been reported to have a lower forward voltage drop than Schottky diodes that use a silicon semiconductor.

Although a tradeoff actually exists between the ON resistivity and switching speed of a power device, power devices that use a SiC semiconductor may be able to simultaneously achieve low ON resistivity and fast switching speed. Reduction of the contact resistivity of the ohmic contact (electrical contact portion) between an electrode film and the SiC semiconductor is important in reduction of the ON resistivity of a SiC semiconductor power device. Ohmic contact resistivity is also a significant problem in achieving high speed switching in a SiC semiconductor power device. The lack of a technique to form a practical low-resistivity ohmic contact adapted to device structures and production (manufacturing) processes is one obstacle in realizing a practical power device that uses a SiC semiconductor.

A method has been proposed that is widely used to form a low resistivity ohmic contact with an n-type SiC semiconductor. The method involves adhering an electrode film onto a portion of an n-type SiC semiconductor and heat treating the formed ohmic electrode structure at about 800 to 1200 degrees C. (for example, refer to Japanese Laid-Open Patent Publication No. 2013-222823, Published Japanese-Translation of PCT Application, Publication No. 2011/115294, and Japanese Laid-Open Patent Publication No. 2013-219150). Nickel (Ni), tungsten (W), titanium (Ti), and the like are commonly known electrode materials. In particular, among ohmic contacts where nickel is used as a material of the electrode, a very promising ohmic contact achieves a practical contact resistivity on the order of $10^{-6}$ $\Omega cm^2$.

Nonetheless, when nickel is used as an electrode material, the nickel film and a portion of the SiC semiconductor react consequent to the high-temperature heat treatment and form, as an electrode film, a reaction layer (e.g., nickel silicide (NiSi) film) for which the conductivity reflects a combination of nickel, silicon, and carbon (C). Here, many of the carbon atoms liberated (diffused) from the SiC semiconductor are deposited near the surface of the electrode film and the surface of the electrode film is substantially covered by a carbon layer of the deposited carbon atoms. Consequently, adhesion between the electrode film and, for example, an aluminum (Al) film (wiring layer) stacked (formed) on the electrode film for wiring becomes poor and as a result the wiring layer may peel.

To address this problem concerning the carbon film deposited on the surface of the nickel silicide film with the generation of the nickel silicide film that becomes the electrode film, Japanese Laid-Open Patent Publication No. 2013-222823 describes removal of the carbon layer by heat treatment before formation of the wiring layer on the nickel silicide film. Published Japanese-Translation of PCT Application, Publication No. 2011/115294 and Japanese Laid-Open Patent Publication No. 2013-219150 describe suppressing the deposition of carbon atoms on the surface of the electrode film by adjusting the material composition ratio of the electrode film and generating a carbide by reacting the electrode film and the carbon atoms liberated from the SiC semiconductor when the ohmic contact of the electrode film and the SiC semiconductor is formed.

SUMMARY OF THE INVENTION

As described, when an ohmic contact between an electrode film and a SiC semiconductor is formed by forming a nickel film (electrode material) on a SiC semiconductor portion followed by heat treatment, carbon atoms liberated from the SiC semiconductor are deposited on the surface of the electrode film, arising in a problem that films such as an aluminum film formed on the electrode film are prone to peeling.

According to one aspect of the present invention, a method of manufacturing a silicon carbide semiconductor device and forming an ohmic contact of a silicon carbide semiconductor element substrate of an n-type and a surface electrode film formed on a surface of the silicon carbide semiconductor element substrate, includes forming on the surface of the silicon carbide semiconductor element substrate, as the surface electrode film, a first electrode film that includes nickel; forming on a surface of the first electrode film, as the surface electrode film, a second electrode film that includes a nickel silicide; and forming the ohmic contact of the silicon carbide semiconductor element substrate and the surface electrode film by heat treating so as to cause silicon atoms of the silicon carbide semiconductor element substrate and nickel atoms of the first electrode film to react and convert the first electrode film into a silicide. The first electrode film is formed to have a thin thickness so that a content of carbon atoms that are liberated from the silicon carbide semiconductor element substrate when the first electrode film is converted into the silicide and the diffuse toward the surface electrode film is low so as to enable the carbon atoms to be taken into the second electrode film.

Further, in the method of manufacturing a silicon carbide semiconductor device, the second electrode film is formed having a thickness that with respect to the carbon atoms taken into the second electrode film during the heat treating, enables suppression of deposition of the carbon atoms to a surface of the second electrode film.

In the method of manufacturing a silicon carbide semiconductor device, the second electrode film is formed having a composition that enables reaction with the silicon carbide semiconductor element substrate during the heat treating to be suppressed.

In the method of manufacturing a silicon carbide semiconductor device, the second electrode film has a composition of nickel and silicon wherein the nickel is in a range of 60 atm % to 70 atm % of the composition and the silicon of the composition is in a corresponding range of 40 atm % to 30 atm % of the composition.

In the method of manufacturing a silicon carbide semiconductor device, the second electrode film is formed having a composition that is substantially equivalent to a composition of the first electrode film after conversion into the silicide at the heat treating process.

In the method of manufacturing a silicon carbide semiconductor device, a thickness of the first electrode film ranges from 5 nm to 10 nm.

In the method of manufacturing a silicon carbide semiconductor device, a thickness of the second electrode film is at least 80 nm.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 1 is a flowchart of an overview of a method of manufacturing a silicon carbide semiconductor device according to an embodiment;

FIG. 2 is a cross-sectional view of a silicon carbide semiconductor device according to the embodiment during manufacture;

FIG. 4 is a chart of first electrode film thickness (Ni film thickness) and surface composition of a first electrode film after heat treatment in a first example;

FIG. 5 is a chart of second electrode film thickness (NiSi film thickness) and surface composition of a second electrode film in a second example; and FIG. 6 is a property diagram of elemental analysis in a direction depth of the surface electrode film in a second example.

DETAILED DESCRIPTION OF THE INVENTION

Figure 3:
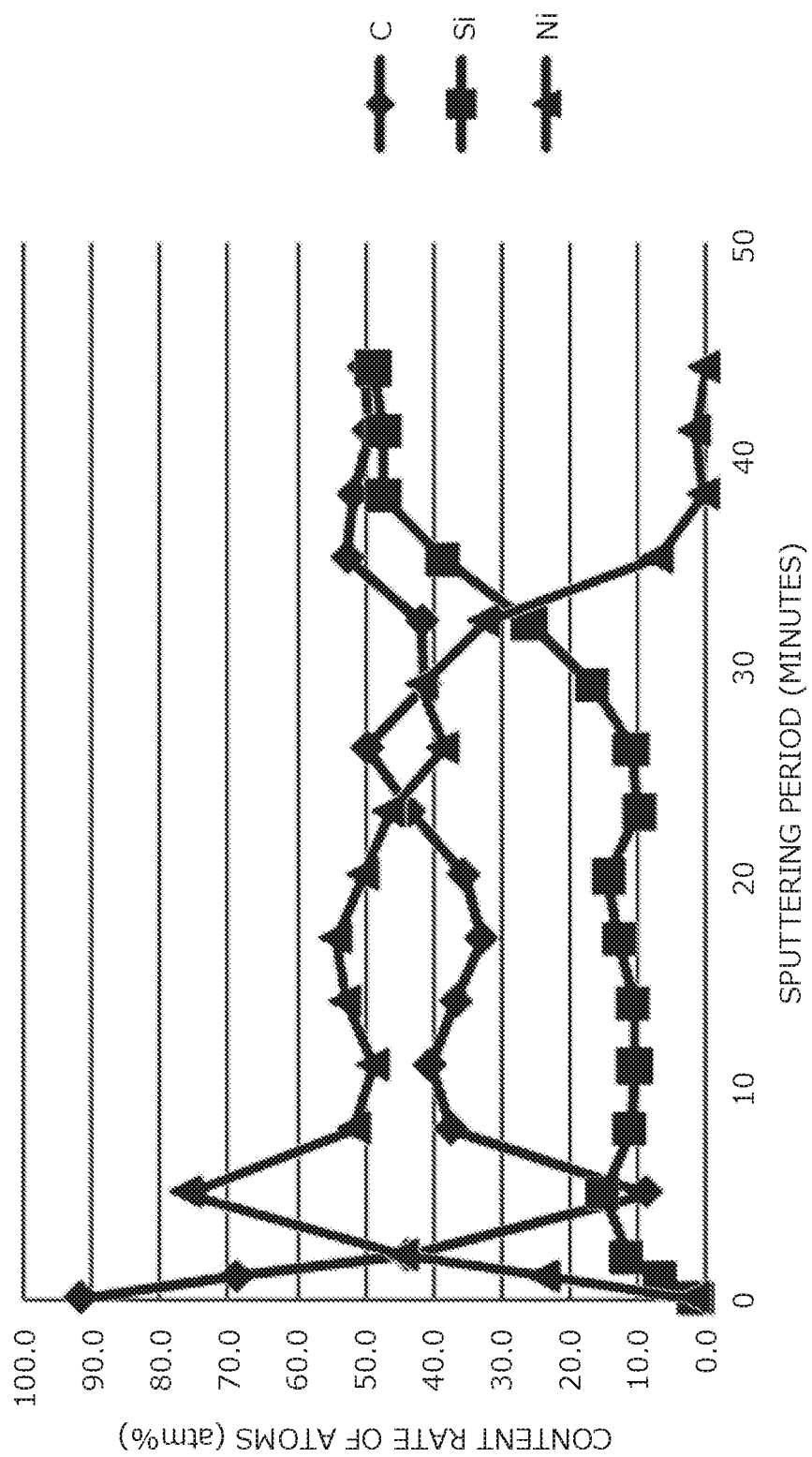
FIG. 3 is a property diagram of element distribution in a direction of depth of a surface electrode film in a first conventional example.

Preferred embodiments of a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not repeatedly be described.

A method of forming an ohmic contact of a surface electrode film and a semiconductor portion (SiC semiconductor portion) formed from a silicon carbide (SiC) semiconductor will be described with respect to the method of manufacturing a silicon carbide semiconductor device according to an embodiment. FIG. 1 is a flowchart of an overview of the method of manufacturing a silicon carbide semiconductor device according to an embodiment. FIG. 2 is a cross-sectional view of a silicon carbide semiconductor device according to the embodiment during manufacture. FIG. 2 depicts a state immediately after a surface electrode film 4 that is formed by a first and a second electrode film 2, 3 sequentially stacked on an n-type SiC semiconductor portion 1 is formed. The n-type SiC semiconductor portion 1 is, for example, an n-type semiconductor substrate (hereinafter, SiC substrate) formed from an n-type SiC semiconductor, an n-type SiC semiconductor layer stacked on a SiC substrate, or an n-type SiC region disposed on a surface layer of a SiC substrate. The surface electrode film 4 may be formed as a front surface electrode or a back surface electrode among silicon carbide semiconductor elements (silicon carbide semiconductor devices) having the n-type SiC semiconductor portion 1.

A predetermined element structure (device structure) is formed by a general method (step S1). In other words, at step S1, a silicon carbide semiconductor element (semiconductor chip) that has the n-type SiC semiconductor portion 1 is produced. Structural units of an element structure are semiconductor layers and/or semiconductor regions formed corresponding to the element structure. An element structure may be a structure formed on a surface of and inside the n-type SiC semiconductor portion 1 by structural units, or may be a structure that includes the n-type SiC semiconductor portion 1 as one component. More specifically, when a MOSFET is produced (manufactured), structural units of an element structure are, for example, a p-type base region and an n$^+$-type source region configuring a metal oxide semiconductor (MOS) gate structure that is a front surface element structure, n$^+$-type drain region configuring a back surface element structure, and the like. The silicon carbide semiconductor element having the n-type SiC semiconductor portion 1 is cleaned by a general method (step S2).

As depicted in FIG. 2, a first electrode film 2 formed from nickel (Ni) is formed on the n-type SiC semiconductor portion 1 (surface) (step S3). The thickness of the first electrode film 2 is thinned by heat treatment (described hereinafter) to an extent that most of the nickel reacts with the silicon atoms inside the n-type SiC semiconductor portion 1 to form a silicide, i.e., nickel silicide ($Ni_2Si$) (hereinafter, "first solid state") film. For example, the thickness may be 5 nm to 10 nm. For example, subsequent to the formation of the first electrode film 2, a second electrode film 3 (hereinafter, "second solid state") formed from nickel silicide (NiSi) is formed on the first electrode film 2 (step S4). As a result, the surface electrode film 4 is formed by the sequentially stacked (formed) first and second electrode films 2, 3. At step S4, the second electrode film 3 may be formed to have a composition that is similar to the nickel silicide ($Ni_2Si$) of the first solid state generated by reacting the nickel atoms and the silicon atoms inside the SiC semiconductor by heat treatment. In other words, the composition of the second electrode film 3 may be similar to the composition of the first electrode film 2 after heat treatment. The thickness of the second electrode film 3, for example, may be 80 nm or greater.

Further, at steps S3 and S4, direct current (DC) sputtering, for example, may be used to deposit the first and second electrode films 2, 3. More specifically, for example, the SiC semiconductor base substrate (the entire portion of the silicon carbide semiconductor element, formed by the SiC semiconductor including the n-type SiC semiconductor portion 1) inserted in the treatment furnace of a sputtering device is subjected to direct current of 300 W, at room temperature (e.g., 25 degrees C.), i.e., sputtering is performed in an argon (Ar) gas atmosphere at a pressure of 1 Pa without heating the SiC semiconductor base substrate. The raw material metal of the sputtering target for depositing the first electrode film 2 may be, for example, nickel of a purity of 99.99 wt %. The raw material metal of the sputtering target for depositing the second electrode film 3, for example, may be a metal of a composition that is within a range of 60Ni40Si (containing 60 atm % nickel atoms and 40 atm % silicon atoms) to 70Ni30Si (containing 70 atm % nickel atoms and 30 atm % silicon atoms).

Next, SiC semiconductor base substrate (entire element) with the first and second electrode films 2, 3 stacked thereon is heat treated at a high temperature in a vacuum atmosphere (step S5). More specifically, at step S5, for example, high temperature heat treatment is performed in a vacuum atmosphere evacuated to $5 \times 10^4$ Pa or less at a temperature of about 1000 degrees C. for about 5 minutes, followed by cooling to room temperature. By this heat treatment, nickel atoms inside the first electrode film 2 and silicon atoms in the n-type SiC semiconductor portion 1 react, generating a heat treatment reactant having a conductivity reflecting a predetermined atomic ratio of nickel atoms to silicon atoms. More specifically, the first electrode film 2 is formed into a silicide whereby nickel silicide ($Ni_2Si$) of the first solid state is generated. Here, the entire first electrode film 2 is substantially converted into a silicide whereby the first electrode film 2 becomes a nickel silicide ($Ni_2Si$) film of the first solid state. Further, as described above, since the second electrode film 3 before heat treatment is formed from the nickel silicide (NiSi) of the second solid state (or, has a composition similar to the first electrode film 2 after heat treatment), substantially the entire surface electrode film 4 (the first and second electrode films 2, 3) after heat treatment becomes a nickel silicide film.

Further, since the thickness of the first electrode film 2 is thin, in the heat treatment at step S5, the amount of carbon (C) atoms that remain from the reaction of the first electrode film 2 and the n-type SiC semiconductor portion 1 is a very small quantity. Furthermore, excess carbon atoms resulting from the reaction of the first electrode film 2 and the n-type SiC semiconductor portion 1 are taken in by the second electrode film 3. Being a metal film that includes silicon, the second electrode film 3 does not react with the silicon atoms in the n-type SiC semiconductor portion 1. In other words, in the surface electrode film 4 formed by the stacked first and second electrode films 2, 3, the first electrode film 2 alone reacts with the n-type SiC semiconductor portion 1 and excess carbon atoms that result do not diffuse outside the surface electrode film 4. In other words, the deposition of carbon atom on the surface of the second electrode film 3 (interface with a wiring layer described hereinafter) is suppressed. Next, a wiring layer (not depicted), for example, including aluminum (Al) is formed on the second electrode film 3 (step S6). Thereafter, general processes are performed after the formation of the wiring layer, whereby a silicon carbide semiconductor element that includes the surface electrode film 4 forming an ohmic contact with the n-type SiC semiconductor portion 1 is completed.

The amount of carbon atoms deposited from the surface electrode film 4 was verified. FIG. 3 is a property diagram of element distribution in a direction of depth of the surface electrode film in a first conventional example. FIG. 4 is a chart of first electrode film thickness (Ni film thickness) and surface composition of the first electrode film after heat treatment in a first example. FIG. 5 is a chart of second electrode film thickness (NiSi film thickness) and surface composition of the second electrode film in a second example. FIG. 6 is a property diagram of elemental analysis in the direction depth of the surface electrode film in the second example. The element distribution in FIGS. 3 and 6 and the surface composition in FIGS. 4 and 5 are both measures of composition in the direction of depth of the surface electrode film by sputtering and detection by X-ray Photoelectron Spectroscopy (XPS) performed alternately.

First, by a conventional method of manufacturing a silicon carbide semiconductor device, a surface electrode film that forms an ohmic contact with an n-type SiC semiconductor portion was formed (hereinafter, the first conventional example). More specifically, in the first conventional example, after a nickel film having a thickness of 100 nm was deposited on an n-type SiC semiconductor portion, a surface electrode film that is formed by converting the nickel film into a silicide by heat treatment was formed. Heat treatment conditions of the first conventional example were identical to those of the first example described hereinafter. Further, by XPS, element distribution in the direction of depth from an outermost surface of the surface electrode film (the surface on the opposite side of surface electrode film with respect to an n-type SiC semiconductor portion side thereof) was measured. The results are depicted in FIG. 3. The results depicted in FIG. 3 confirm that in the first conventional example, silicon atoms and carbon atoms in the n-type SiC semiconductor portion, i.e., a portion deeper than where nickel atoms=0 atm % (corresponds to long sputtering period (the right side of FIG. 3)) diffuse into the surface electrode film, and a large amount of carbon atoms are deposited on the outermost surface of the surface electrode film (corresponds to sputtering period=0 minutes (the left side of FIG. 3)).

Generally, nickel is known to react with SiC semiconductors to form nickel silicide ($Ni_2Si$) of the first solid state. The results depicted in FIG. 3 confirm that in the first conventional example, silicon atoms that diffused into the surface electrode film from the n-type SiC semiconductor portion reacted with the nickel atoms in the surface electrode film to form the nickel silicide ($Ni_2Si$) of the first solid state. Further, carbon atoms that diffused into the surface electrode film from the n-type SiC semiconductor portion were confirmed to deposit on the outermost surface of the surface electrode film. The carbon layer deposited on the outermost surface of the surface electrode film has poor adhesion with an aluminum film. Therefore, in this state, when a wiring layer including aluminum is deposited on the outermost surface of the surface electrode film, the wiring layer is prone to peeling. Thus, to improve adhesion with the wiring layer, the carbon atoms in the n-type SiC semiconductor portion have to be prevented from diffusing out to the outermost surface of the surface electrode film, or the carbon atoms that remain after the reaction of the surface electrode film and the n-type SiC semiconductor portion have to be removed.

Next, the thickness of the first electrode film 2 was investigated as a condition to enable suppression of the diffusion of the carbon atoms in the n-type SiC semiconductor portion. First, multiple samples in which the surface electrode film 4 that forms an ohmic contact with the n-type SiC semiconductor portion 1 were produced according to the method of manufacturing a silicon carbide semiconductor device according to the embodiment described (hereinafter, first example). More specifically, in the first example, the first electrode film 2 that includes nickel was deposited on the n-type SiC semiconductor portion 1 to have a thickness that varied according to sample, and after the second electrode film 3 formed from the nickel silicide (NiSi) of the second solid state was deposited on the first electrode film 2 to have a thickness of 80 nm, heat treatment was performed under the illustrated conditions. Nickel having a purity of 99.99 wt % was used as a raw material metal of the sputtering target to deposit the first electrode film 2. 67Ni33Si (metal including 67 atm % nickel and 33 atm % silicon) was used as a raw material metal of the sputtering target to deposit the second electrode film 3. Subsequently, by XPS, element distribution in the direction of depth from the outermost surface (the surface of the second electrode film 3) of the surface electrode film 4 formed by the first and second electrode films 2, 3 was measured. The results are depicted in FIG. 4. In FIG. 4, the carbon composition (C composition) is the amount of carbon atoms deposited on the surface of the second electrode film 3 (similarly in FIG. 5).

The results depicted in FIG. 4 confirm that the thicker the first electrode film 2 is, the greater the amount of carbon atoms deposited on the surface of the first electrode film 2 (interface of the first electrode film 2 and the second electrode film 3) is. This phenomenon occurs because a large amount of nickel atoms in the first electrode film 2 and silicon atoms in the n-type SiC semiconductor portion 1 react whereby excess carbon atoms easily result. Although the first electrode film 2 may be made thin, if the first electrode film 2 is excessively thin (e.g., about 5 nm or less), reaction of the nickel atoms in the first electrode film 2 and the silicon atoms in the n-type SiC semiconductor portion 1 becomes insufficient, adversely affecting ohmic properties. Therefore, the thickness of the first electrode film 2 may be about 5 nm to 10 nm, which enables a favorable ohmic contact to be formed with the n-type SiC semiconductor portion 1.

Next, the thickness of the second electrode film 3 was investigated as a condition to enable suppression of the diffusion of the carbon atoms in the n-type SiC semiconductor portion. First, multiple samples (hereinafter, second example) in which the surface electrode film 4 that forms an ohmic contact with the n-type SiC semiconductor portion 1 were produced according to the method of manufacturing a silicon carbide semiconductor device according to the embodiment described. More specifically, in the second example, the first electrode film 2 that includes nickel was deposited on the n-type SiC semiconductor portion 1 to have a thickness of 10 nm, and after the second electrode film 3 formed from the nickel silicide (NiSi) of the second solid state was deposited on the first electrode film 2 to have a thickness that varied according to sample, heat treatment was performed. Conditions of the manufacturing method in the second example were identical to those of the first example with the exception of the condition concerning the thickness of the first and second electrode films 2, 3. Subsequently, by XPS, element distribution in the direction of depth from the outermost surface (the surface of the second electrode film 3) of the surface electrode film 4 formed by the first and second electrode films 2, 3 was measured. The results are depicted in FIGS. 5 and 6.

As depicted in FIG. 6, in the second example, the content of carbon atoms was confirmed to decrease from the interface of the n-type SiC semiconductor portion 1 and the surface electrode film 4 (portion where nickel atoms=0 atm % (the right side of FIG. 6)), toward the outermost surface electrode film 4 (corresponds to sputtering period=0 minutes (the left side of FIG. 6)). In other words, the diffusion of carbon atoms from the n-type SiC semiconductor portion 1 to the surface electrode film 4 is suppressed. When the thickness of the first electrode film 2 is 10 nm, the content of carbon atoms deposited on the surface of the first electrode film 2 (interface of the first electrode film 2 and the second electrode film 3) is 14 atm % (refer to FIG. 4). Therefore, by forming the second electrode film 3 to have a thickness of 80 nm or greater, which can control the content of the carbon atoms deposited on the outermost surface of the surface electrode film 4 to be 14 atm % or less, deposition of the carbon atoms diffused in the surface electrode film 4 on the outermost surface of the surface electrode film 4 can be suppressed (refer to FIG. 5).

Adhesion of the surface electrode film 4 and the wiring layer was verified. First, a sample (hereinafter, third example) was produced in which the surface electrode film 4 formed by the first electrode film 2 having a thickness of 10 nm and the second electrode film 3 having a thickness of 80 nm sequentially deposited by sputtering on a 20 mm×20 mm SiC substrate (semiconductor chip) was formed and heat treated. The manufacturing method in the third example was identical to that in the first example. For comparison, a sample (hereinafter, second conventional example) was produced in which a nickel film (surface electrode film) having a thickness of 90 nm was deposited and heat treated. Conditions of the manufacturing method in the second conventional example were identical to those of the first conventional example with the exception of the condition concerning thickness of the nickel film. Further, with respect to the third example and the second conventional example, an aluminum film (wiring layer) having a thickness of 5 μm was formed in the outermost surface of the surface electrode film and peeling of the aluminum film was checked by pulling off tape attached to the aluminum film. The results confirmed that in the second conventional example, substantially the entire aluminum film peeled. On the other hand, in the third example, peeling of the aluminum film was confirmed to not occur. As described, in the third example, the thickness of the first electrode film 2 was made 10 nm or less and the thickness of the second electrode film 3 was made 80 nm or greater to form the surface electrode film 4 whereby, it is presumed that the carbon atoms depositing on the outermost surface of the surface electrode film 4 could be reduced.

As described, according to the embodiment, formation of the surface electrode film on the n-type SiC semiconductor portion, by the thin first electrode film and the second electrode film of nickel silicide, in the heat treatment thereafter, the region of the surface electrode film that is converted into a silicide by reacting with the silicon atoms in the n-type SiC semiconductor portion can be limited to the thin first electrode film. In other words, since the region that is converted into a silicide by the reaction with the silicon atoms in the n-type SiC semiconductor portion can be decreased as compared to a conventional method, the amount of excess carbon atoms during the heat treatment can be reduced. Further, these excess carbon atoms are taken in by the second electrode film, enabling the deposition of the carbon atoms on the outermost surface (the surface of the second electrode film) of the surface electrode film to be suppressed. As a result, the adhesion between the surface electrode film and the wiring layer formed on the outermost surface of the surface electrode film can be strengthened, making peeling of the wiring layer less likely to occur.

Further, according to the embodiment, even when the region of the surface electrode film converted into a silicide is decreased as compared to a convention case, the adhesion between the surface electrode film and the n-type SiC semiconductor portion is maintained to the same degree as a conventional case because substantially the entire portion (first electrode film) of the surface electrode film contacting the n-type SiC semiconductor portion is converted into the nickel silicide ($Ni_2Si$) of the first solid state. As a result, peeling of the surface electrode film from the n-type SiC semiconductor portion can be prevented. Further, since substantially the entire portion of the surface electrode film contacting the n-type SiC semiconductor portion is converted into the nickel silicide ($Ni_2Si$) of the first solid state, an ohmic contact with the n-type SiC semiconductor portion can be formed to substantially the same extent as a conventional case. As a result, the contact resistivity of the first electrode film and the n-type SiC semiconductor portion can be reduced. Therefore, the deposition of excess carbon atoms inside the film and on the outermost surface is suppressed whereby a surface electrode film that ensures adhesion with the wiring layer and exhibits favorable ohmic properties may be formed.

The present invention is not limited by the embodiment described, and in the description, various design modifications can be made without departing from the spirit of the present invention.

According to the method of manufacturing a silicon carbide semiconductor device of the present invention, the region of the surface electrode film reacting with the silicon atoms in the silicon carbide semiconductor element substrate is the first electrode film alone, whereby excess carbon atoms that result from heat treatment can be decreased. Further, these excess carbon atoms are taken in by the second electrode film. Thus, deposition of the carbon atoms to the outermost surface of the surface electrode film is suppressed.

According to the method of manufacturing a silicon carbide semiconductor device of the present invention, an effect is achieved in that when forming an ohmic contact by heat treatment, the deposition of carbon atoms to the electrode film surface is suppressed and adhesion with a wiring layer stacked on the electrode film can be ensured.

As described, the method of manufacturing a silicon carbide semiconductor device according to the present invention is useful for silicon carbide semiconductor devices used in automobiles and machines used in various industries, and is particularly suitable for silicon carbide semiconductor devices equipped with a surface electrode film that forms an ohmic contact with an n-type SiC semiconductor portion.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a silicon carbide semiconductor device, having a silicon carbide semiconductor element substrate and a surface electrode film forming an ohmic contact therebetween, the method comprising:
    depositing on, and in direct contact with the surface of the silicon carbide semiconductor element substrate, a nickel film as a first electrode film;
    depositing on, and in direct contact with a surface of the first electrode film, a second electrode film that includes nickel silicide; and
    after the depositing the second electrode film, forming the surface electrode film having the ohmic contact between the surface of the silicon carbide semiconductor element substrate and the first electrode film by annealing so as to cause silicon atoms of the silicon carbide semiconductor element substrate and nickel atoms of the first electrode film to react and convert the first electrode film into a silicide, wherein
    the depositing the first electrode film includes depositing the first electrode film to have a first thickness so that, during the annealing, a first amount of carbon atoms is liberated from the silicon carbide semiconductor element substrate and diffuses toward the first electrode film, said first amount being equal to or lower than a second amount of carbon atoms that the second electrode film is able to take in during the annealing.

2. The method of manufacturing a silicon carbide semiconductor device according to claim 1, wherein the second electrode film is deposited having a second thickness so that, during the annealing, the first amount is equal to or less than the second amount, thereby suppressing deposition of carbon atoms on a surface of the second electrode film.

3. The method of manufacturing a silicon carbide semiconductor device according to claim 1, wherein the second electrode film is deposited having a composition that suppresses reaction with the silicon carbide semiconductor element substrate during the annealing.

4. The method of manufacturing a silicon carbide semiconductor device according to claim 1, wherein the second electrode film has a composition of nickel and silicon wherein the nickel of the composition is in a range of 60 atm % to 70 atm % of the composition and the silicon of the composition is in a corresponding range of 30 atm % to 40 atm % of the composition.

5. The method of manufacturing a silicon carbide semiconductor device according to claim 1, wherein the second thickness of the second electrode film is at least 80 nm.

6. The method of manufacturing a silicon carbide semiconductor device according to claim 1, wherein the first electrode film consists essentially of nickel.

7. A method of manufacturing a silicon carbide semiconductor device having a silicon carbide semiconductor element substrate and a surface electrode film forming an ohmic contact therebetween, the method comprising:
    forming on the surface of the silicon carbide semiconductor element substrate, a first electrode film that includes nickel;
    forming on a surface of the first electrode film, a second electrode film that includes nickel silicide; and
    forming the surface electrode film having the ohmic contact between the surface of the silicon carbide semiconductor element substrate and the first electrode film by annealing so as to cause silicon atoms of the silicon carbide semiconductor element substrate and nickel atoms of the first electrode film to react and convert the first electrode film into a silicide, wherein
    the forming the first electrode film includes forming the first electrode film to have a first thickness so that, during the annealing, a first amount of carbon atoms is liberated from the silicon carbide semiconductor element substrate and diffuses toward the first electrode film, said first amount being equal to or lower than a second amount of carbon atoms that the second electrode film is able to take in during the annealing, and
    the second electrode film is formed so as to have a composition, prior to the annealing, that corresponds to the composition of the first electrode film after the conversion by the annealing of the first electrode film into a silicide.

8. A method of manufacturing a silicon carbide semiconductor device having a silicon carbide semiconductor element substrate and a surface electrode film forming an ohmic contact therebetween, the method comprising:
    forming on the surface of the silicon carbide semiconductor element substrate, a first electrode film that includes nickel;

forming on a surface of the first electrode film, a second electrode film that includes nickel silicide; and forming the surface electrode film having the ohmic contact between the surface of the silicon carbide semiconductor element substrate and the first electrode film by annealing so as to cause silicon atoms of the silicon carbide semiconductor element substrate and nickel atoms of the first electrode film to react and convert the first electrode film into a silicide, wherein the forming the first electrode film includes forming the first electrode film to have a first thickness so that, during the annealing, a first amount of carbon atoms is liberated from the silicon carbide semiconductor element substrate and diffuses toward the first electrode film, said first amount being equal to or lower than a second amount of carbon atoms that the second electrode film is able to take in during the annealing, and the first thickness of the first electrode film is in a range of 5 nm to 10 nm.

* * * * *